(12) United States Patent
Jung et al.

(10) Patent No.: US 12,183,783 B2
(45) Date of Patent: Dec. 31, 2024

(54) STACKED STRUCTURE INCLUDING TWO-DIMENSIONAL MATERIAL AND METHOD OF FABRICATING THE STACKED STRUCTURE

(71) Applicant: Samsung Electronics Co., Ltd., Suwon-si (KR)

(72) Inventors: Alum Jung, Suwon-si (KR); Kyung-Eun Byun, Seongnam-si (KR); Keunwook Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 17/882,169

(22) Filed: Aug. 5, 2022

(65) Prior Publication Data
US 2023/0096121 A1 Mar. 30, 2023

(30) Foreign Application Priority Data

Sep. 24, 2021 (KR) .................. 10-2021-0126710

(51) Int. Cl.
*H01L 29/06* (2006.01)
*H01L 21/02* (2006.01)

(52) U.S. Cl.
CPC .... *H01L 29/0642* (2013.01); *H01L 21/02271* (2013.01); *H01L 21/0262* (2013.01)

(58) Field of Classification Search
CPC ............. H01L 29/1606; H01L 29/778; H01L 21/02568; H01L 29/66439; H01L 21/02513; H01L 29/165; H01L 21/285; H01L 29/0847; H01L 29/78; H01L 21/02439
See application file for complete search history.

(56) References Cited

U.S. PATENT DOCUMENTS

| | | | |
|---|---|---|---|
| 8,476,765 B2 | 7/2013 | Zhang et al. | |
| 8,541,769 B2 | 9/2013 | Chu et al. | |
| 9,482,960 B2 | 11/2016 | Yakunin et al. | |
| 10,312,329 B2 | 6/2019 | Zhou | |
| 2018/0269059 A1* | 9/2018 | Lin | H01L 29/78681 |
| 2019/0348466 A1 | 11/2019 | Pillarisetty et al. | |
| 2020/0185532 A1* | 6/2020 | Lin | H01L 21/02568 |

(Continued)

FOREIGN PATENT DOCUMENTS

KR 20170130784 A 11/2017
KR 20180004583 A 1/2018

OTHER PUBLICATIONS

J. Park et al., 'Pristine Graphene Insertion at the Metal/ Semiconductor Interface to Minimize Metal-Induced Gap States' ACS Appl. Mater. Interfaces., 2021, vol. 13, No. 19, pp. 22828-22835.

(Continued)

*Primary Examiner* — Julia Slutsker
(74) *Attorney, Agent, or Firm* — HARNESS, DICKEY & PIERCE, P.L.C.

(57) ABSTRACT

A stacked structure may include a first material layer, a two-dimensional material layer on the first material layer, and a second material layer on the two-dimensional material layer. The two-dimensional material layer may include a plurality of holes that each expose a portion of the first material layer. The second material layer may be coupled to the first material layer through the plurality of holes.

21 Claims, 9 Drawing Sheets

(56) References Cited

U.S. PATENT DOCUMENTS

2020/0350164 A1    11/2020  Lee et al.
2021/0234028 A1*    7/2021  Detzel ................. H01L 29/0684
2022/0246737 A1*    8/2022  Loghmany .......... H01L 29/2003

OTHER PUBLICATIONS

S. Mahaboob Jilani et al., 'Studies on resistive switching characteristics of aluminum/graphene oxide/semiconductor nonvolatile memory cells' *Carbon*, vol. 64, 2013, pp. 187-196.

* cited by examiner

STACKED STRUCTURE INCLUDING TWO-DIMENSIONAL MATERIAL AND METHOD OF FABRICATING THE STACKED STRUCTURE

CROSS-REFERENCE TO RELATED APPLICATION

This application is based on and claims priority under 35 U.S.C. § 119 to Korean Patent Application No. 10-2021-0126710, filed on Sep. 24, 2021, in the Korean Intellectual Property Office, the disclosure of which is incorporated by reference herein in its entirety.

BACKGROUND

1. Field

The present disclosure relates to a stacked structure including a two-dimensional material and/or a method of fabricating the stacked structure and, more specifically, to a stacked structure having improved stability by adjusting the coverage of a two-dimensional material layer, and/or a method of fabricating the stacked structure.

2. Description of the Related Art

In the field of semiconductor device technology, research on various two-dimensional materials including graphene has been actively conducted to solve issues of increased resistance due to a decrease in the width of metal wirings and meet the necessity to develop novel metal barrier materials. In order to apply a two-dimensional material to a semiconductor device, it may be advantageous in view of a manufacturing process to directly grow a two-dimensional material on a semiconductor substrate.

When directly growing the two-dimensional material on the semiconductor substrate, only a weak van der Waals force acts between the semiconductor substrate and the two-dimensional material, and thus, adhesion between the semiconductor substrate and the two-dimensional material may not sufficiently strong to withstand subsequent processes. Accordingly, in order to improve the stability of a semiconductor device including a two-dimensional material, it may be necessary to increase the adhesion between a semiconductor substrate and the two-dimensional material.

SUMMARY

According to various embodiments of the present disclosure, provided are a stacked structure including a two-dimensional material having improved adhesion between constituent layers by adjusting the coverage of a two-dimensional material layer, and/or a method of fabricating a stacked structure.

Additional aspects will be set forth in part in the description which follows and, in part, will be apparent from the description, or may be learned by practice of the presented embodiments of the disclosure.

According to an embodiment, a stacked structure may include a first material layer, a two-dimensional material layer on the first material layer, and a second material layer on the two-dimensional material layer. The two-dimensional material layer may include a plurality of holes that each expose a portion of the first material layer. The second material layer may be coupled to the first material layer through the plurality of holes.

In some embodiments, a coverage of the two-dimensional material layer on a top surface of the first material layer may be about 0.6 to about 0.99.

In some embodiments, an adhesion energy between the first material layer and the second material layer may be about 1 $J/m^2$ to about 30 $J/m^2$.

In some embodiments, the two-dimensional material layer may include at least one of black phosphorus, amorphous boron nitride, two-dimensional hexagonal boron nitride (h-BN), phosphorene, or transition metal dichalcogenide.

In some embodiments, the transition metal dichalcogenide may include one metal element and one chalcogen element. The metal element may include at least one of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb). The chalcogen element may include at least one of sulfur (S), selenium (Se), and tellurium (Te).

In some embodiments, the first material layer may include a metal material.

In some embodiments, the metal material may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge).

In some embodiments, the second material layer may include a semiconductor material.

In some embodiments, the second material layer may include a material including at least two elements combined with each other. The at least two elements combined with each other may include at least two of Si, Ge, C, Zn, Cd, Al, Ga, In, B, C, N, P, S, Se, As, Sb, and Te.

In some embodiments, the second material layer may include an insulating material.

In some embodiments, the insulating material may include at least one of an oxide, a nitride, and a carbide. The at least one of an oxide, a nitride, and a carbide may include at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

In some embodiments, the first material layer may include a semiconductor material.

In some embodiments, the second material layer may include any one of a semiconductor material or an insulating material.

In some embodiments, the semiconductor material of the first material layer may include a material including at least two elements combined with each other. The at least two elements combined with each other, in the semiconductor material of the first material layer, may include at least two of Si, Ge, C, Zn, Cd, Al, Ga, In, B, C, N, P, S, Se, As, Sb, and Te.

In some embodiments, the second material layer may directly contact the first material layer through the plurality of holes.

In some embodiments, a material of the first material layer may be different than a material of the second material layer. One of the first material layer and the second material layer may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

According to an embodiment, a method of fabricating a stacked structure may include forming a two-dimensional material layer on a first material layer, the two-dimensional material layer including a plurality of holes each exposing a portion of the first material layer; and forming a second material layer on the two-dimensional material layer such that the second material layer may be coupled to the first material layer through the plurality of holes.

In some embodiments, the forming the two-dimensional material layer may include forming the two-dimensional material layer using at least one of a chemical vapor deposition (CVD) method or an atomic layer deposition (ALD) method.

In some embodiments, the forming the two-dimensional material layer may include forming the two-dimensional material layer such that a coverage of the two-dimensional material layer on a top surface of the first material layer may be about 0.6 to about 0.99.

In some embodiments, the first material layer may include a metal material.

In some embodiments, the metal material may include at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge).

In some embodiments, the second material layer may include a semiconductor material.

In some embodiments, the semiconductor material layer may include a material in which at least two elements combined with each other. The at least elements combined with each other may include at least two of Si, Ge, C, Zn, Cd, Al, Ga, In, B, C, N, P, S, Se, As, Sb, and Te.

In some embodiments, the second material layer may include an insulating material.

In some embodiments, the insulating material may include at least one of an oxide, a nitride, and a carbide. The at least one of an oxide, a nitride, and a carbide may include at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
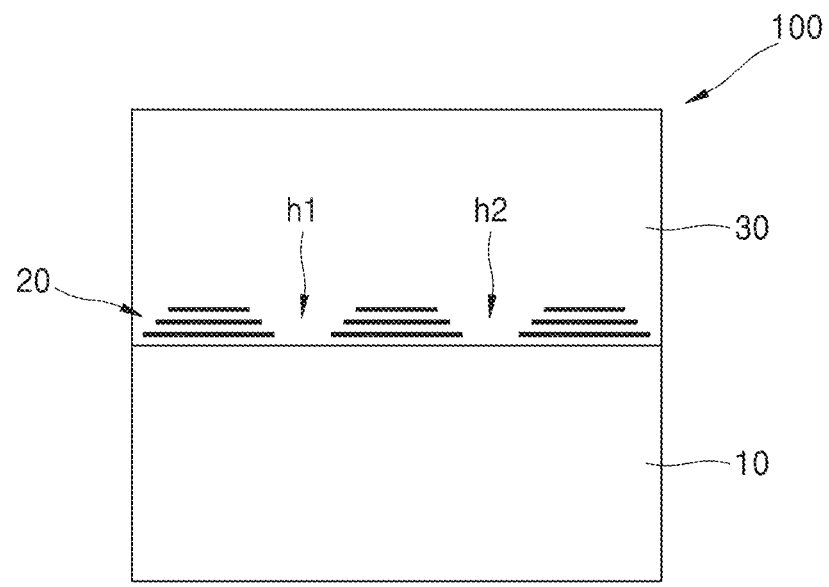
FIG. 1 is a diagram schematically illustrating of an example configuration of a stacked structure including a two-dimensional material, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the drawings, the size or thickness of each element may be exaggerated for clarity and convenience of description.

When an element is referred to as being "on" or "above" another element, the element may directly contact a top/bottom/left/right portion of the other element, or may be on/under/next to the other element with intervening elements therebetween.

Terms such as "first" or "second" may be used to describe various elements, but the elements should not be limited by the terms. These terms are only used to distinguish one element from another element.

The singular expression also includes the plural meaning as long as it is not inconsistent with the context. When an element is referred to as "including" a component, the element may additionally include other components rather than excluding other components as long as there is no particular opposing recitation.

The term "the" and other demonstratives similar thereto should be understood to include a singular form and plural forms.

The operations of a method may be performed in any suitable order unless otherwise indicated herein or otherwise clearly contradicted by context. In addition, all example terms (e.g., "such as" or "etc.") are used for the purpose of description and are not intended to limit the scope of the present disclosure unless defined by the claims.

Figure 2:
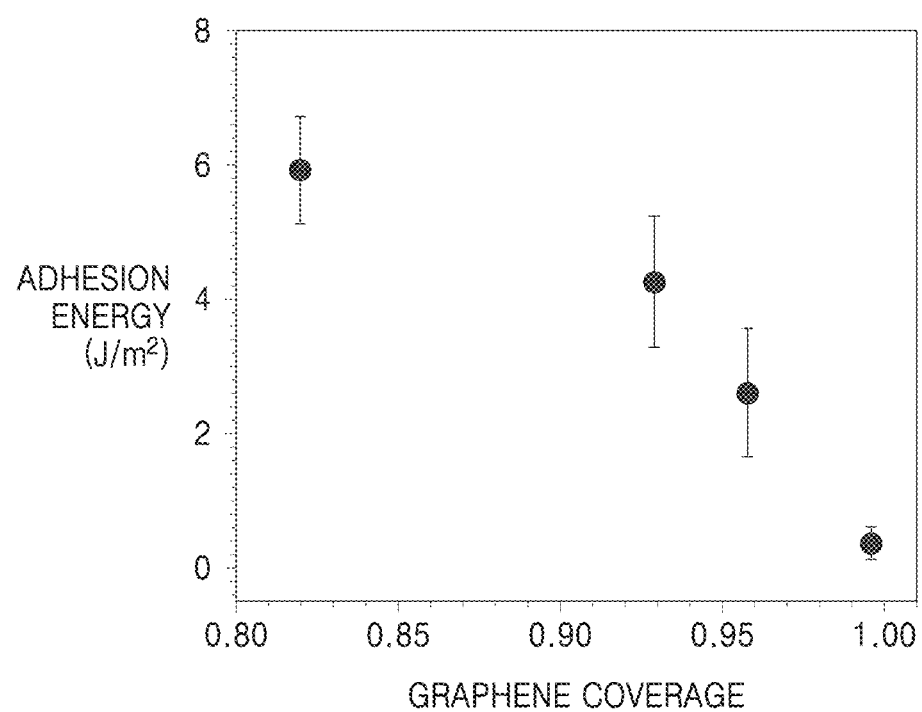
FIG. 2 is a graph for describing a change in the adhesion between a first material layer and a second material layer according to the coverage of a two-dimensional material layer including graphene.
Figure 3:
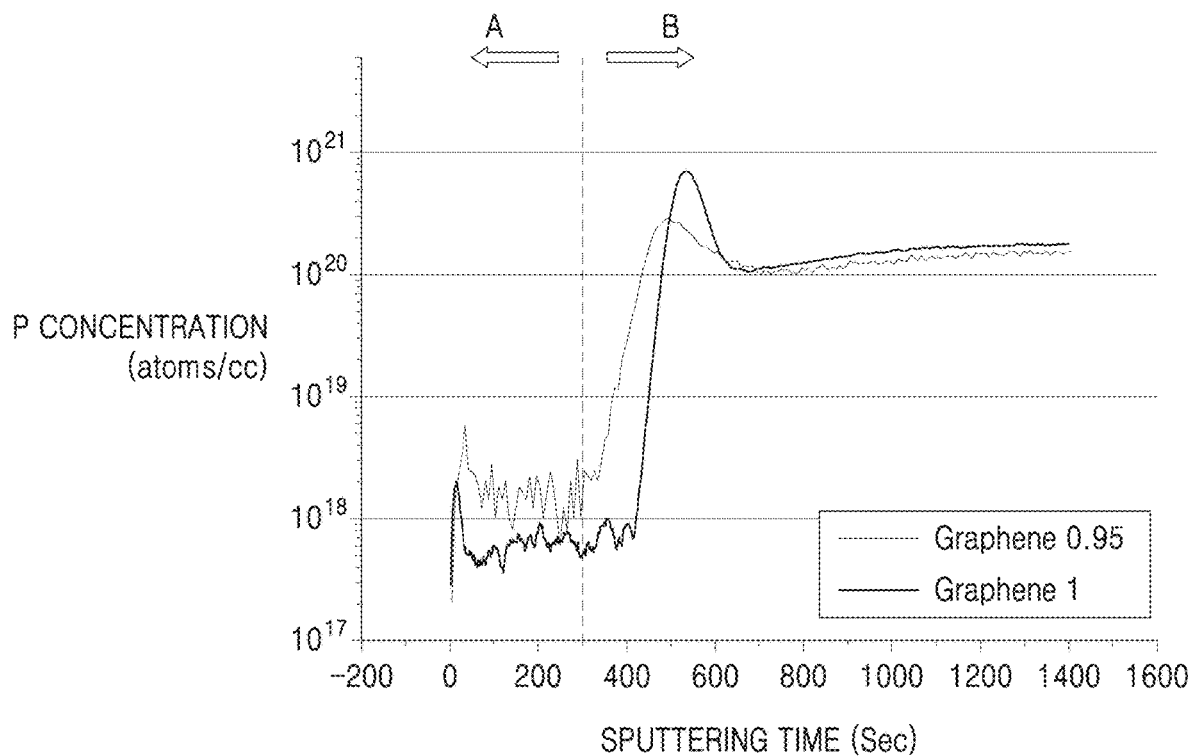
FIG. 3 is a graph for describing barrier characteristics of a two-dimensional material layer.

FIG. 1 is a diagram schematically illustrating of an example configuration of a stacked structure 100 including a two-dimensional material, according to an embodiment. FIG. 2 is a graph for describing a change in the adhesion between a first material layer 10 and a second material layer 30 according to the coverage of a two-dimensional material layer 20 including graphene. FIG. 3 is a graph for describing barrier characteristics of the two-dimensional material layer 20.

Referring to FIG. 1, the stacked structure 100 including the two-dimensional material according to an embodiment may include the first material layer 10, the two-dimensional material layer 20, which is on the first material layer 10 and includes a plurality of holes h1 and h2 each exposing a portion of the first material layer 10, and the second material layer 30, which is on the two-dimensional material layer 20 and is coupled to the first material layer 10 through the plurality of holes h1 and h2.

The first material layer 10 may include a metal material. For example, the first material layer 10 may include at least one metal selected from the group consisting of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge), or an alloy thereof.

Here, the first material layer 10 including a metal may be thermally annealed to obtain crystallinity of the metal surface. For example, the first material layer 10 may have improved crystallinity of the metal surface through a thermal annealing process performed at a high temperature.

The two-dimensional material layer 20 may be stacked on the top surface of the first material layer 10 and may include the plurality of holes h1 and h2. Although two holes h1 and h2 are illustrated in FIG. 1, the two-dimensional material layer 20 may include two or more holes. For example, the ratio of the plurality of holes h1 and h2 to the two-dimensional material layer 20 may be about 1% to about 40%. The diameters, shapes, and the like of the plurality of holes h1 and h2 included in the two-dimensional material layer 20 may be different from each other, respectively. The plurality of holes h1 and h2 may each expose a portion of the top surface of the first material layer 10.

As described above, the two-dimensional material layer 20 may have a structure including the plurality of holes h1 and h2 each exposing a portion of the top surface of the first material layer 10, and the coverage of the two-dimensional material layer 20 on the upper surface of the first material layer 10 may be about 0.6 to about 0.99. Accordingly, the two-dimensional material layer 20 may be formed to cover only a portion of the top surface of the first material layer 10. Regions that do not cover the top surface of the first material layer 10 may be formed, at intervals, on the bottom surface of the two-dimensional material layer 20 facing the top surface of the first material layer 10. For example, the two-dimensional material layer 20 may include graphene.

The second material layer 30 may include a semiconductor material. For example, the second material layer 30 may include a semiconductor such as a IV, III-V, II-VI, and IV-VI semiconductor, and a semiconductor compound. The second material layer 30 may include a material in which at least two elements of Si, Ge, C, Zn, Cd, Al, Ga, In, B, C, N, P, S, Se, As, Sb, and Te are combined with each other. For example, the second material layer 30 may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

The second material layer 30 may be coupled to the first material layer 10 through the plurality of holes h1 and h2 included in the two-dimensional material layer 20. For example, portions of the first material layer 10 may be exposed by the plurality of holes h1 and h2, respectively, and portions of the bottom surface of the second material layer 30 may be formed to fill the plurality of holes h1 and h2, respectively, and thus to be in contact with the exposed portions of the first material layer 10, respectively. As described above, the portions of the first material layer 10 and the portions of the second material layer 30, which are in contact with each other through the plurality of holes h1 and h2, may be coupled to each other. In this case, the adhesion energy between the first material layer 10 and the second material layer 30 may be about 1 $J/m^2$ to about 30 $J/m^2$.

Referring to FIG. 2, in the case where the two-dimensional material layer 20 includes graphene, the adhesion energy between the first material layer 10 and the second material layer 30 may change according to the coverage of the two-dimensional material layer 20 on the first material layer 10. For example, when the coverage of the two-dimensional material layer 20 including graphene on the first material layer 10 is about 0.8, 0.93, 0.96, and 0.95, the adhesion energy between the first material layer 10 and the second material layer 30 may be about 6 $J/m^2$, 4.2 $J/m^2$, 2.65 $J/m^2$, and 0.4 $J/m^2$, respectively. As described above, by adjusting the coverage of the two-dimensional material layer 20 on the first material layer 10, the adhesion energy between the first material layer 10 and the second material layer 30 may be adjusted.

In the case where only the two-dimensional material layer 20 is formed on the first material layer 10, the adhesion between the first material layer 10 and the two-dimensional material layer 20 may not be high enough to withstand stress in semiconductor processes. However, by coupling the first material layer 10 and the second material layer 30, which are respectively below and on the two-dimensional material layer 20, to each other through the plurality of holes h1 and h2 included in the two-dimensional material layer 20, the overall adhesion of the stacked structure 100 may be improved. Accordingly, the two-dimensional material layer 20 may be more stably positioned between the first material layer 10 and the second material layer 30, and the stability of the stacked structure 100 may be improved.

Referring to FIG. 3, even in the case where the coverage of the two-dimensional material layer 20 on the first material layer 10 is less than 1, the two-dimensional material layer 20 may function as a barrier between the first material layer 10 and the second material layer 30. For example, in the case where the coverage of the material layer 20 including graphene on the first material layer 10 is 1, the measured concentration of p-type impurities of the second material layer 30 in section A where the sputtering time of the stacked structure 100 is about 300 seconds or less may be about $10^{18}$ atoms/cc. In addition, in the case where the coverage of the material layer 20 including graphene on the first material layer 10 is 0.95, the measured concentration of the p-type impurities of the second material layer 30 in section A where the sputtering time of the stacked structure 100 is about 300 seconds or less may be about $5 \times 10^{18}$ atoms/cc, which does not exceed a reference value for functioning as a barrier. As described above, even in the case where the coverage of the two-dimensional material layer 20 on the first material layer 10 is less than 1, the two-dimensional material layer 20 may function as a barrier between the first material layer 10 and the second material layer 30.

Figure 4:
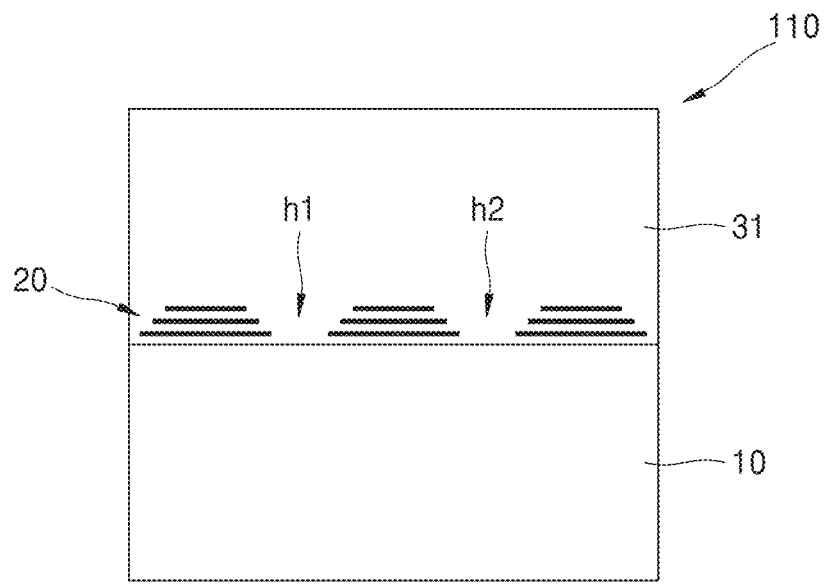
FIG. 4 is a diagram schematically illustrating an example configuration of a stacked structure including a two-dimensional material, according to another embodiment.

FIG. 4 is a diagram schematically illustrating an example configuration of a stacked structure 110 including a two-dimensional material, according to another embodiment. The stacked structure 110 of FIG. 4 may be substantially the same as the stacked structure 100 of FIG. 1, except that a second material layer 31 includes a material different from that of the second material layer 30 of FIG. 1. In describing FIG. 4, descriptions that are provided in connection with FIGS. 1 to 3 will be omitted.

Referring to FIG. 4, the stacked structure 110 including the two-dimensional material according to an embodiment may include the first material layer 10, the two-dimensional material layer 20, which is on the first material layer 10 and includes the plurality of holes h1 and h2 each exposing a portion of the first material layer 10, and the second material layer 31, which is on the two-dimensional material layer 20 and is coupled to the first material layer 10 through the plurality of holes h1 and h2.

The second material layer 31 may include an insulating material. For example, the second material layer 31 may include at least one of oxides, nitrides, and carbides of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

Figure 5:
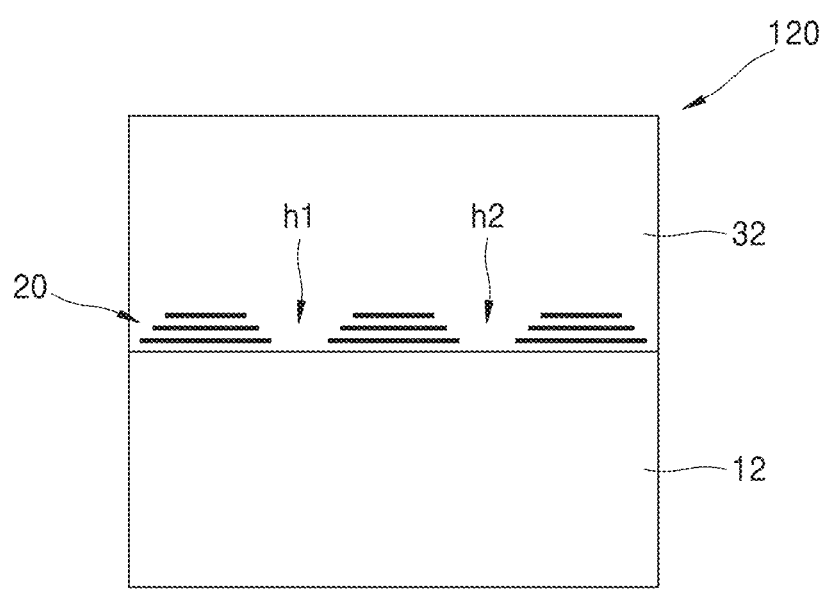
FIG. 5 is a diagram schematically illustrating an example configuration of a stacked structure including a two-dimensional material, according to another embodiment.

FIG. 5 is a diagram schematically illustrating an example configuration of a stacked structure 120 including a two-dimensional material, according to another embodiment. The stacked structure 120 of FIG. 5 may be substantially the same as the stacked structure 100 of FIG. 1, except that a first material layer 12 and a second material layer 32 include materials different from those of the first material layer 10 and the second material layer 30 of FIG. 1, respectively. In describing FIG. 5, descriptions that are provided in connection with FIGS. 1 to 3 will be omitted.

Referring to FIG. 5, the stacked structure 120 including the two-dimensional material according to an embodiment may include the first material layer 12, the two-dimensional material layer 20, which is on the first material layer 12 and includes the plurality of holes h1 and h2 each exposing a portion of the first material layer 12, and the second material layer 32, which is on the two-dimensional material layer 20 and is coupled to the first material layer 12 through the plurality of holes h1 and h2.

The first material layer 12 may include a semiconductor material. For example, the first material layer 12 may include a semiconductor such as a IV, III-V, II-VI, or IV-VI semiconductor, and a semiconductor compound. The first material layer 12 may include a material in which at least two elements of Si, Ge, C, Zn, Cd, Al, Ga, In, B, C, N, P, S, Se, As, Sb, and Te are combined with each other. For example, the first material layer 12 may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

The second material layer 32 may include a metal material. For example, the second material layer 32 may include at least one metal selected from the group consisting of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge), or an alloy thereof.

Figure 6:
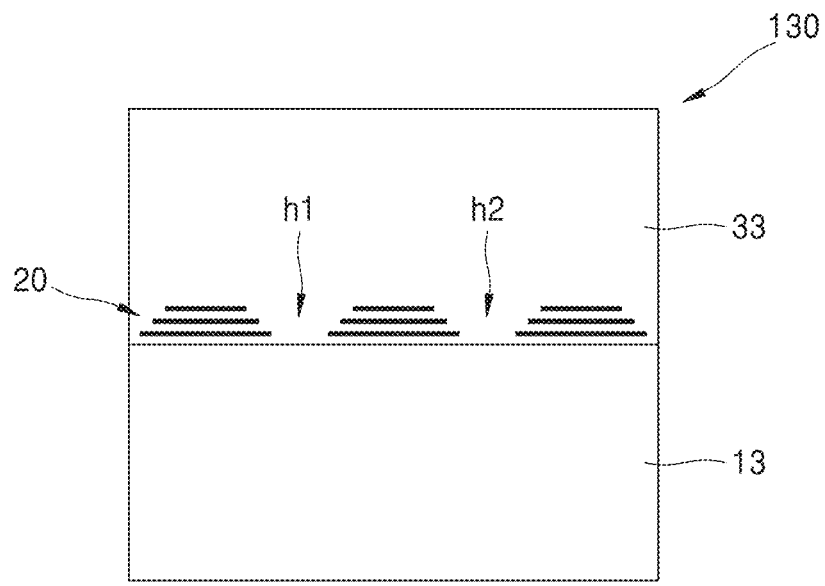
FIG. 6 is a diagram schematically illustrating an example configuration of a stacked structure including a two-dimensional material, according to another embodiment.

FIG. 6 is a diagram schematically illustrating an example configuration of a stacked structure 130 including a two-dimensional material, according to another embodiment. The stacked structure 130 of FIG. 6 may be substantially the same as the stacked structure 100 of FIG. 1, except that a first material layer 13 and a second material layer 33 include materials different from those of the first material layer 10 and the second material layer 30 of FIG. 1, respectively. In describing FIG. 6, descriptions that are provided in connection with FIGS. 1 to 3 will be omitted.

Referring to FIG. 6, the stacked structure 130 including the two-dimensional material according to an embodiment may include the first material layer 13, the two-dimensional material layer 20, which is on the first material layer 13 and includes the plurality of holes h1 and h2 each exposing a portion of the first material layer 13, and the second material layer 33, which is on the two-dimensional material layer 20 and is coupled to the first material layer 13 through the plurality of holes h1 and h2.

The first material layer 13 may include a semiconductor material. For example, the first material layer 13 may include a semiconductor such as a IV, III-V, II-VI, or IV-VI semiconductor, and a semiconductor compound. The first material layer 13 may include a material in which at least two elements of Si, Ge, C, Zn, Cd, Al, Ga, In, B, C, N, P, S, Se, As, Sb, and Te are combined with each other. For example, the first material layer 13 may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

The second material layer 33 may include an insulating material. For example, the second material layer 33 may include at least one of oxides, nitrides, and carbides of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

Figure 7:
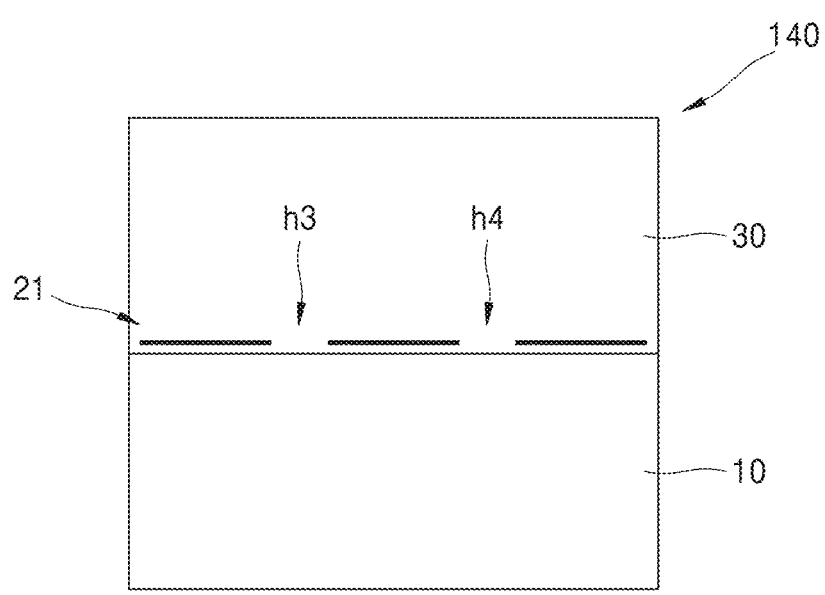
FIG. 7 is a diagram schematically illustrating an example configuration of a stacked structure including a two-dimensional material, according to another embodiment.

FIG. 7 is a diagram schematically illustrating an example configuration of a stacked structure 140 including a two-dimensional material, according to another embodiment. The stacked structure 140 of FIG. 7 may be substantially the same as the stacked structure 100 of FIG. 1, except that a two-dimensional material layer 21 includes a material different from that of the two-dimensional material layer 20 of FIG. 1. In describing FIG. 7, descriptions that are provided in connection with FIGS. 1 to 3 will be omitted.

Referring to FIG. 7, the stacked structure 140 including the two-dimensional material according to an embodiment may include the first material layer 10, the two-dimensional material layer 21, which is on the first material layer 10 and includes the plurality of holes h3 and h4 each exposing a portion of the first material layer 10, and the second material layer 30, which is on the two-dimensional material layer 21 and is coupled to the first material layer 10 through the plurality of holes h3 and h4.

The two-dimensional material layer 21 may include at least one of black phosphorus, amorphous boron nitride, two-dimensional hexagonal boron nitride (h-BN), phosphorene, or transition metal dichalcogenide.

Here, the transition metal dichalcogenide may include one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb), and one chalcogen element selected from the group consisting of sulfur (S), selenium (Se), and tellurium (Te).

For example, the two-dimensional material layer 21 may include at least one of $MoS_2$, $WS_2$, $WSe_2$, $MoTe_2$, $WTe_2$, $ZrS_2$, $ZrSe_2$, $NbS_2$, $TaS_2$, $TiS_2$, $NiSe_2$, GaSe, GaTe, InSe, and $Bi_2Se_3$.

Figure 8:
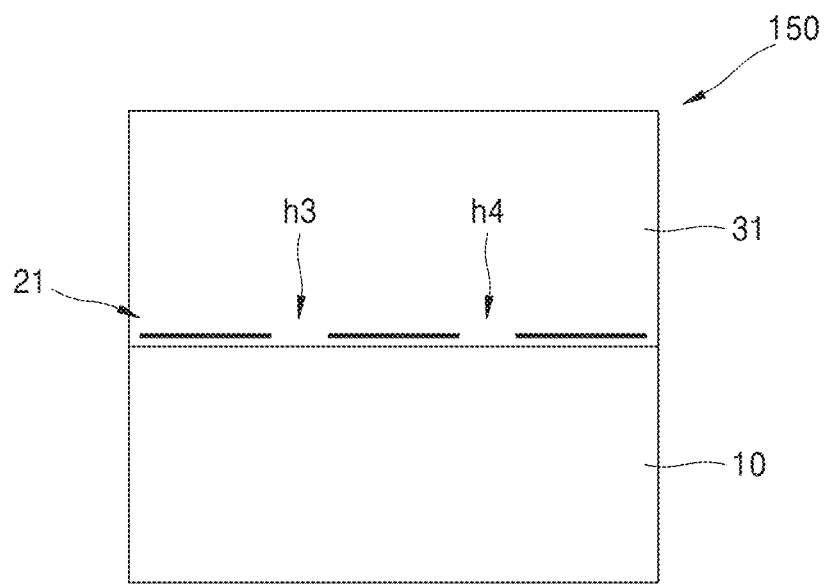
FIG. 8 is a diagram schematically illustrating an example configuration of a stacked structure including a two-dimensional material, according to another embodiment.

FIG. 8 is a diagram schematically illustrating an example configuration of a stacked structure 150 including a two-dimensional material, according to another embodiment. The stacked structure 150 of FIG. 8 may be substantially the same as the stacked structure 140 of FIG. 7, except that the second material layer 31 includes a material different from that of the second material layer 30 of FIG. 7. In describing FIG. 8, descriptions that are provided in connection with FIGS. 1 to 3 and 7 will be omitted.

Referring to FIG. 8, the stacked structure 150 including the two-dimensional material according to an embodiment may include the first material layer 10, the two-dimensional material layer 21, which is on the first material layer 10 and includes the plurality of holes h3 and h4 each exposing a portion of the first material layer 10, and the second material layer 31, which is on the two-dimensional material layer 21 and is coupled to the first material layer 10 through the plurality of holes h3 and h4.

The second material layer 31 may include an insulating material. For example, the second material layer 31 may include at least one of oxides, nitrides, and carbides of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

Figure 9:
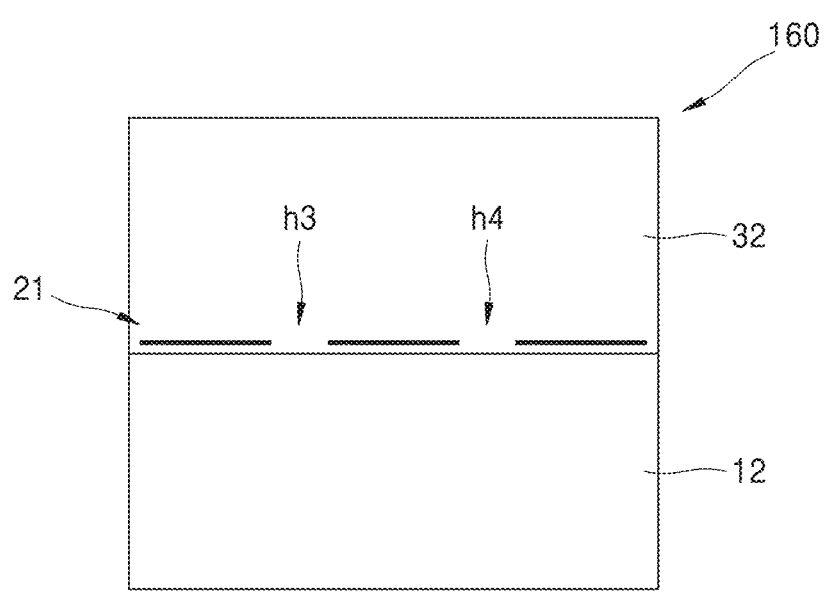
FIG. 9 is a diagram schematically illustrating an example configuration of a stacked structure including a two-dimensional material, according to another embodiment.

FIG. 9 is a diagram schematically illustrating an example configuration of a stacked structure 160 including a two-dimensional material, according to another embodiment. The stacked structure 160 of FIG. 9 may be substantially the same as the stacked structure 140 of FIG. 7, except that the first material layer 12 and the second material layer 32 include materials different from those of the first material layer 10 and the second material layer 30 of FIG. 7, respectively. In describing FIG. 9, descriptions that are provided in connection with FIGS. 1 to 3 and 7 will be omitted.

Referring to FIG. 9, the stacked structure 160 including the two-dimensional material according to an embodiment may include the first material layer 12, the two-dimensional material layer 21, which is on the first material layer 12 and includes the plurality of holes h3 and h4 each exposing a portion of the first material layer 12, and the second material layer 32, which is on the two-dimensional material layer 21 and is coupled to the first material layer 12 through the plurality of holes h3 and h4.

The first material layer 12 may include a semiconductor material. For example, the first material layer 12 may include a semiconductor such as a IV, III-V, II-VI, or IV-VI semiconductor, and a semiconductor compound. The first material layer 12 may include a material in which at least two elements of Si, Ge, C, Zn, Cd, Al, Ga, In, B, C, N, P, S, Se, As, Sb, and Te are combined with each other. For example, the first material layer 12 may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

The second material layer 32 may include a metal material. For example, the second material layer 32 may include at least one metal selected from the group consisting of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge), or an alloy thereof.

Figure 10:
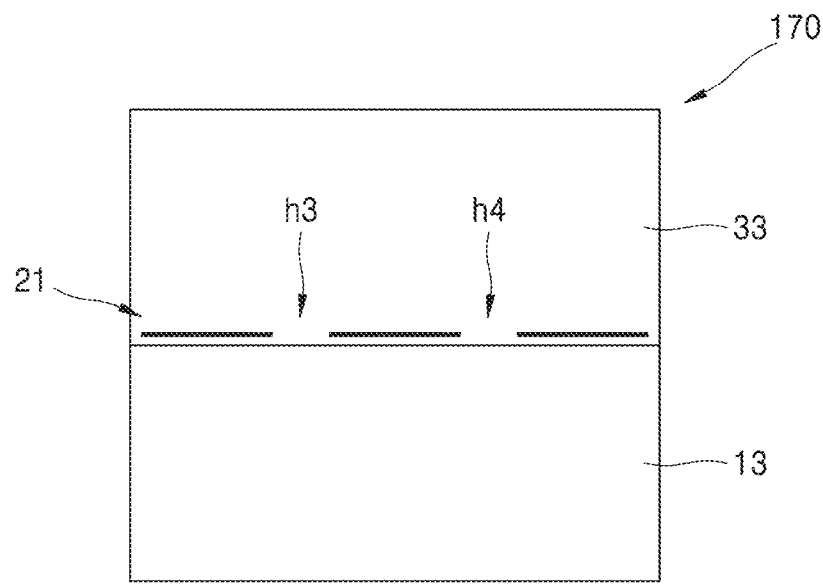
FIG. 10 is a diagram schematically illustrating an example configuration of a stacked structure including a two-dimensional material, according to another embodiment.

FIG. 10 is a diagram schematically illustrating an example configuration of a stacked structure 170 including a two-dimensional material, according to another embodiment. The stacked structure 170 of FIG. 10 may be substantially the same as the stacked structure 140 of FIG. 7, except that the first material layer 13 and the second material layer 33 include materials different from those of the first material layer 10 and the second material layer 30 of FIG. 7, respectively. In describing FIG. 10, descriptions that are provided in connection with FIGS. 1 to 3 and 7 will be omitted.

Referring to FIG. 10, the stacked structure 170 including the two-dimensional material according to an embodiment may include the first material layer 13, the two-dimensional material layer 21, which is on the first material layer 13 and includes the plurality of holes h3 and h4 each exposing a portion of the first material layer 13, and the second material layer 33, which is on the two-dimensional material layer 21 and is coupled to the first material layer 13 through the plurality of holes h3 and h4.

The first material layer 13 may include a semiconductor material. For example, the first material layer 13 may include a semiconductor such as a IV, III-V, II-VI, or IV-VI semiconductor, and a semiconductor compound. The first material layer 13 may include a material in which at least two elements of Si, Ge, C, Zn, Cd, Al, Ga, In, B, C, N, P, S, Se, As, Sb, and Te are combined with each other. For example, the first material layer 13 may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

The second material layer 33 may include an insulating material. For example, the second material layer 33 may include at least one of oxides, nitrides, and carbides of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

Figure 11:
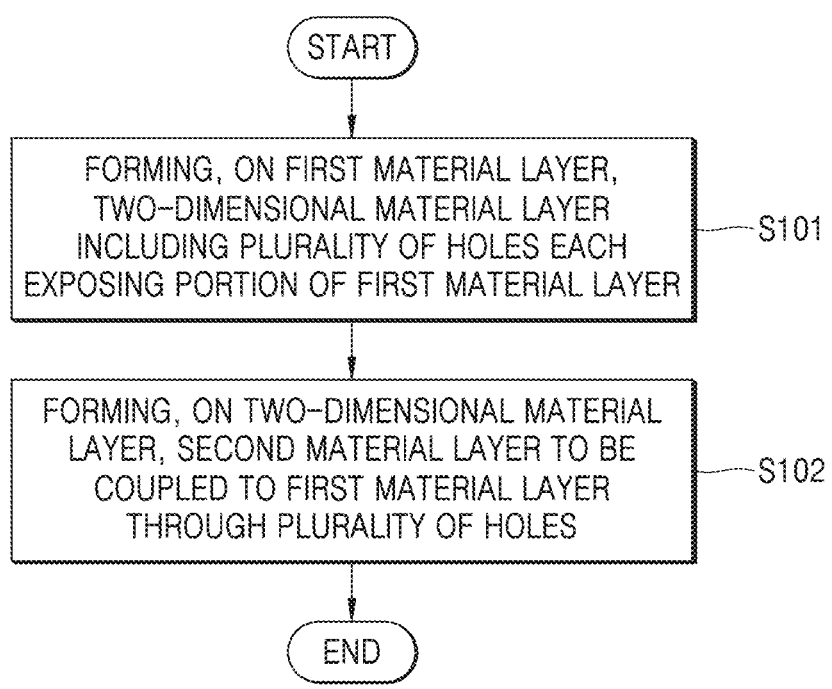
FIG. 11 is a flowchart for describing a method of fabricating a stacked structure including a two-dimensional material, according to an embodiment.

FIG. 11 is a flowchart for describing a method of fabricating a stacked structure including a two-dimensional material, according to an embodiment.

Referring to FIG. 11, the method of fabricating a stacked structure including a two-dimensional material according to an embodiment may include forming, on a first material layer, a two-dimensional material layer including a plurality of holes each exposing a portion of the first material layer (S101), and forming, on the two-dimensional material layer, a second material layer to be coupled to the first material layer through the plurality of holes (S102).

In the forming of the two-dimensional material layer on the first material layer (S101), the two-dimensional material layer may be formed such that the coverage of the two-dimensional material layer on the top surface of the first material layer is about 0.6 to about 0.99. For example, the two-dimensional material layer may include a plurality of holes, and portions of the top surface of the first material layer may be exposed through the plurality of holes included in the two-dimensional material layer, respectively.

The two-dimensional material layer may be formed by using any method generally used in the art for growing a two-dimensional material layer, without particular limitations. For example, the two-dimensional material layer may be formed by using a chemical vapor deposition (CVD) method. The CVD method may include, but is not limited to, a rapid thermal CVD (RTCVD) method, an inductively coupled plasma-CVD (ICP-CVD) method, a low-pressure CVD (LPCVD) method, an atmospheric pressure CVD (APCVD) method, a metal organic CVD (MOCVD) method, and a plasma-enhanced CVD (PECVD) method. Also, the two-dimensional material layer may be formed by using an atomic layer deposition (ALD) method. However, the method of forming the two-dimensional material layer is not limited thereto and may include various deposition methods other than CVD and ALD.

In the forming of the second material layer on the two-dimensional material layer (S102), the second material layer may be formed on the two-dimensional material layer such that portions of the bottom surface of the second material layer fill the plurality of holes included in the two-dimensional material layer, respectively, and thus the second material layer and the second material layer are coupled to each other through the plurality of holes.

The first material layer may include a metal material. For example, the first material layer may include at least one metal selected from the group consisting of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge), or an alloy thereof.

The second material layer may include a semiconductor material. For example, the second material layer may include a semiconductor such as a IV, III-V, II-VI, and IV-VI semiconductor, and a semiconductor compound. The second material layer may include a material in which at least two elements of Si, Ge, C, Zn, Cd, Al, Ga, In, B, C, N, P, S, Se, As, Sb, and Te are combined with each other. For example, the second material layer may include at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, $SnS_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, of a combination thereof.

However, the second material layer is not limited thereto, and may include an insulating material instead of the semiconductor material. For example, the second material layer may include at least one of oxides, nitrides, and carbides of at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

According to various embodiments of the present disclosure, provided are a stacked structure including a two-dimensional material having improved adhesion between constituent layers by adjusting the coverage of a two-dimensional material layer, and a method of fabricating a stacked structure.

According to various embodiments of the present disclosure, provided are a stacked structure including a two-dimensional material having improved adhesion by coupling a lower layer to an upper layer through a plurality of holes included in a two-dimensional material layer, and a method of fabricating a stacked structure.

While the example configurations of stacked structures 100, 110, 120, 130, 140, 150, 160, and 170 discussed above include two material layers, example embodiments are not limited thereto. In some embodiments, a stacked structure may include a two-dimensional material layer between more than two material layers. For example, FIGS. 12A and 12B are diagrams schematically illustrating example configurations of stacked structures including a two-dimensional material, according to some embodiments.

Figure 12A:
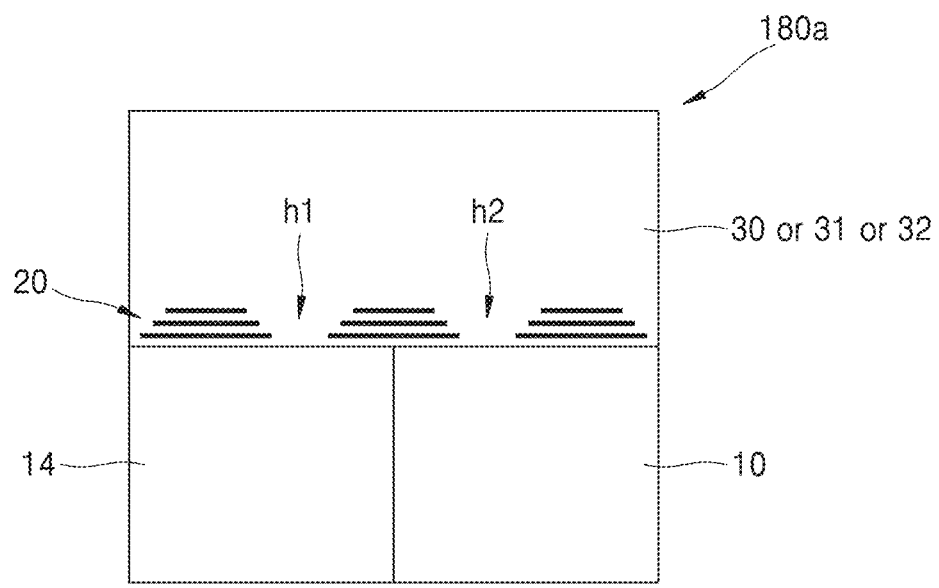
FIGS. 12A and 12B are diagrams schematically illustrating example configurations of stacked structures including a two-dimensional material, according to some embodiments.
Figure 12B:
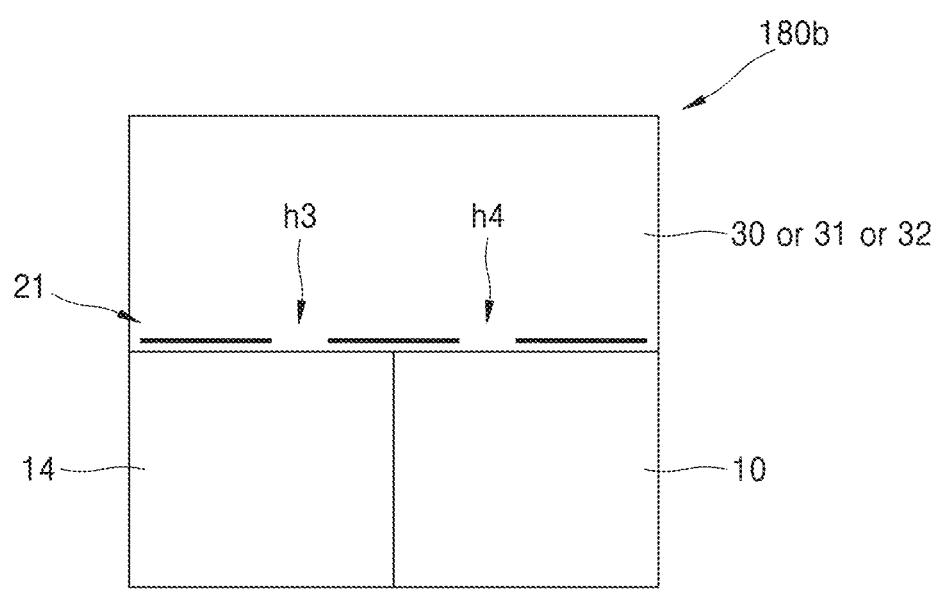

Referring to FIGS. 12A and 12B, stacked structures 180a and 180b may include a two-dimensional material layer 20 (see FIG. 12A) or 21 (see FIG. 12B) on a first material layer 10 and a third material layer 14 next to the first material layer 14. Holes h1 and h2 in the two-dimensional material layer 20 and holes h3 and h4 in the two-dimensional material layer 21 may expose the first material layer 10 and the third material layer 14. A second material layer (30, 31, or 32) may be on the two-dimensional material layers (20, 21) and may be coupled to the first material layer 10 and the third material layer 14 through the holes (h1 and h2 in two-dimensional material layer 20 or h3 and h4 in two-dimensional material layer 21). A material of the third material layer 20 may be different than a material of first material layer 10, different than a material of the second material layer (30, 31, or 32), or different than both of the materials of the first material layer 10 and the second material layer (30, 31, 32). For example, the third material layer 14 may be an insulating material (e.g., silicon oxide) when the first material layer 10 is a metal and the second material layer is a semiconductor, but example embodiments are not limited thereto.

Figure 13:
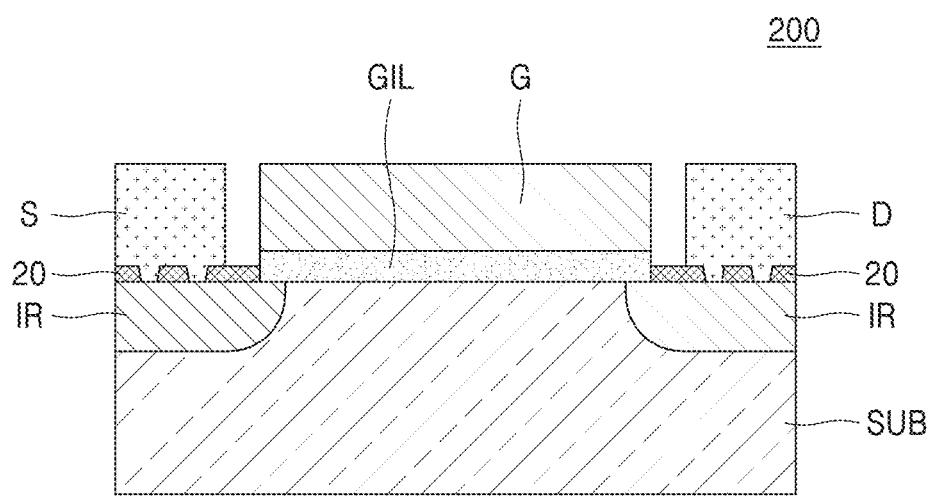
FIG. 13 is a cross-sectional view of an electronic device according to an example embodiment.

FIG. 13 is a cross-sectional view of an electronic device according to an example embodiment.

Referring to FIG. 13, an electronic device 200 according to an embodiment may include a substrate SUB including impurity regions IR spaced apart from each other, a two-dimensional material layer 20 on the substrate and covering the impurity regions IR while exposing a portion of the substrate SUB between the impurity region IR, a source electrode S on one of the impurity regions IR, a drain electrode D spaced apart from the source electrode S and on another one of the impurity regions IR, a gate insulating layer GIL, and a gate electrode G on the gate insulating layer GIL. The gate electrode G may be spaced apart from the source electrode S and drain electrode D on the substrate SUB. The substrate SUB may include a semiconductor material such as silicon or silicon germanium, but is not limited thereto. The gate insulating layer GIL may include an insulating material such as one of silicon oxide, silicon nitride, hafnium oxide, aluminium oxide, and the like. The source electrode S, gate electrode G, and drain electrode D may be formed of conductive materials such as a metal, metal alloy, or doped semiconductor.

As shown in FIG. 13, portions of the source electrode S and drain electrode D may extend through holes in the two-dimensional material layer 20 and may be coupled to the underlying impurity regions IR. The two-dimensional material layer 20 may be formed of graphene, but is not limited thereto. In some embodiments, the two-dimensional material layer 21 described above with reference to FIGS. 7 to 10 may be inserted instead of the two-dimensional material layer 20 in FIG. 13.

Figure 14:
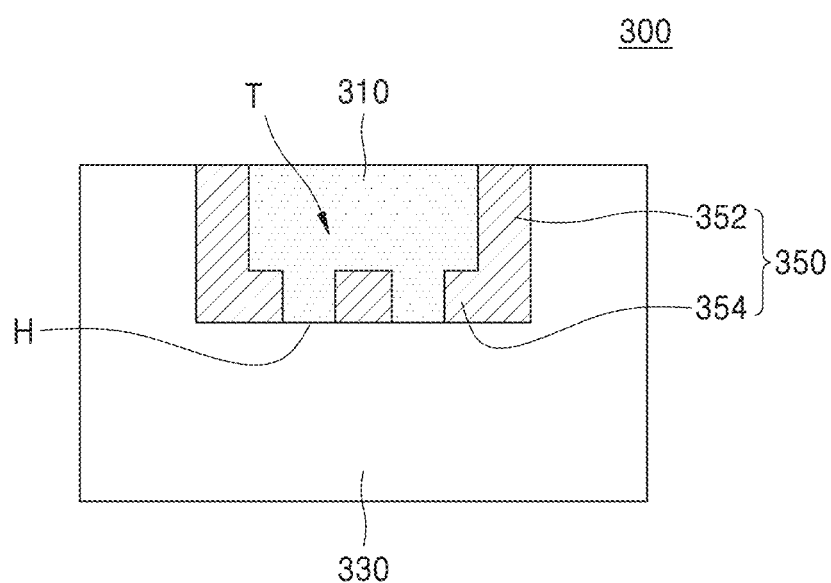
FIG. 14 is a cross-sectional view of an interconnect structure according to an example embodiment.

FIG. 14 is a cross-sectional view of an interconnect structure according to an example embodiment.

Referring to FIG. 14, the interconnect structure 300 may include a second material layer 310, a first material layer 330 surrounding at least a part of the second material layer 310, and a diffusion barrier layer 350 disposed between the second material layer 310 and the first material layer 330 and limiting and/or preventing a metal material of the second material layer 310 from diffusing into the first material layer 330. The diffusion barrier layer 350 may be formed of a two-dimensional material, such as the same material as any one of the two-dimensional material layers 20 and 21 described above with references to FIGS. 1 and 4 to 10. The first material layer 330 and second material layer 310 may include different materials from each other. For example, the first material layer 330 may include an insulating material and the second material layer 310 may include a conductive material (e.g., metal, metal alloy, or conductive semiconductor).

At least one trench T may be formed in the upper portion of the first material layer 330. The second material layer 310 may be disposed in the trench T of the dielectric 330. It is shown in the drawing that one trench is formed in the first material layer 330, but the present disclosure is not limited thereto. Two or more trenches T may be formed in the first material layer 330.

The diffusion barrier layer 350 may include a first portion 352 and a second portion 354 extending in different directions. The first portion 352 may cover a sidewall of the trench T and may surround sides of the second material layer 310. The second portion 354 may cover a bottom surface of the trench T. The second portion 354 may include a plurality of holes H spaced apart from each other and exposing a portion of the first material layer 330 underneath the diffusion barrier layer 350. Portions of the second material layer 310 may be coupled to the first material layer 330 through the plurality of holes H.

Although not shown in FIG. 14, the interconnect structure 300 may be a portion of an electrical connection between a circuit element (e.g., transistor) and a wiring layer of an electrical apparatus.

Figure 15:
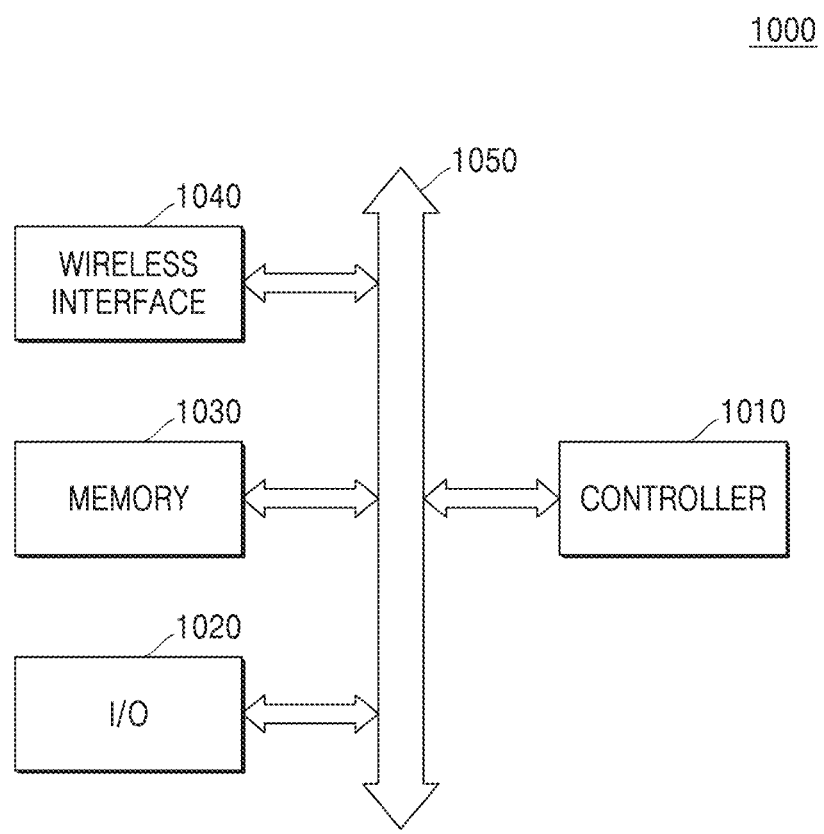
FIG. 15 is a block diagram of an electronic system apparatus according to an example embodiment.

FIG. 15 is a block diagram of an electronic system apparatus according to an example embodiment.

Referring to FIG. 15, in an example embodiment, an electronic system 1000 may form a wireless communication device or a device capable of transmitting and/or receiving information in a wireless environment. The electronic system 1000 may include a controller 1010, an input/output device (I/O) 1020, a memory 1030, and a wireless interface 1040, which are connected to each other through a bus 1050.

The controller 1010 may include at least one selected from the group consisting of a microprocessor, a digital signal processor, and a processing device similar thereto. User's commands may be input through the I/O device 1020 for the controller 1010, and the I/O device 1020 may include at least one selected from the group consisting of a keypad, a keyboard, and a display. The memory 1030 may be used to store instructions executed by controller 1010. For example, the memory 1030 may be used to store user data. The electronic system 1000 may use the wireless interface 1040 to transmit/receive data through a wireless communication network. The wireless interface 1040 may include an antenna and/or a wireless transceiver. In some embodiments, the electronic system 1000 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic system 1000 may include the electronic device 200 and/or interconnect structure 300, described above in FIGS. 13 to 14, in for example the memory 1030 and/or controller 1010.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A stacked structure, the stacked structure comprising:
   a first material layer;
   a two-dimensional material layer directly on the first material layer, the two-dimensional material layer including a plurality of holes each exposing a portion of the first material layer; and
   a second material layer directly on the two-dimensional material layer, the second material layer being coupled to the first material layer through the plurality of holes,
   wherein the two-dimensional material layer comprises at least one of graphene, black phosphorus, amorphous boron nitride, two-dimensional hexagonal boron nitride (h-BN), phosphorene, or transition metal dichalcogenide, and
   wherein the two-dimensional material layer is between the first material layer and the second material layer.

2. The stacked structure of claim 1, wherein a coverage of the two-dimensional material layer on a top surface of the first material layer is about 0.6 to about 0.99.

3. The stacked structure of claim 1, wherein an adhesion energy between the first material layer and the second material layer is about 1 J/m$^2$ to about 30 J/m$^2$.

4. The stacked structure of claim 1, wherein the two-dimensional material layer comprises at least one of the black phosphorus, the amorphous boron nitride, the two-dimensional hexagonal boron nitride (h-BN), the phosphorene, or the transition metal dichalcogenide.

5. The stacked structure of claim 4, wherein
   the two-dimensional material layer comprises the transition metal dichalcogenide,
   the transition metal dichalcogenide comprises one metal element and one chalcogen element,
   the metal element includes at least one of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb), and
   the chalcogen element includes at least one of sulfur(S), selenium (Se), and tellurium (Te).

6. The stacked structure of claim 1, wherein the first material layer comprises at least one of a first metal material, a first semiconductor material, a first insulating material.

7. The stacked structure of claim 6, wherein
   the first material layer includes the first metal material, and
   the first metal material comprises at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge).

8. The stacked structure of claim 6, wherein the second material layer comprises at least one of a second metal material, a second semiconductor material, or a second insulating material.

9. The stacked structure of claim 8, wherein
   the first material layer comprises the first semiconductor material,
   in the first material layer, the first semiconductor material comprises a material including at least two elements combined with each other, and
   the at least two elements combined with each other includes at least two of Si, Ge, C, Zn, Cd, Al, Ga, In, B, C, N, P, S, Se, As, Sb, and Te.

10. The stacked structure of claim 9, wherein
    the second material layer comprises the second insulating material,
    the second insulating material comprises at least one of an oxide, a nitride, and a carbide, and
    the at least one of an oxides, a nitride, and a carbide in the insulating material includes at least one of silicon (Si), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), copper (Cu), molybdenum (Mo), and gadolinium (Gd), and derivatives thereof.

11. The stacked structure of claim 1, wherein the second material layer directly contacts the first material layer through the plurality of holes.

12. The stacked structure of claim 1, wherein
    a material of the first material layer is different than a material of the second material layer, and
    one of the first material layer and the second material layer includes at least one of SiC, BP, BAs, AlN, AlP, AlAs, AlSb, GaN, GaP, GaAs, GaSb, InN, InP, InAs, InSb, CdSe, CdS, CdTe, ZnO, ZnSe, ZnTe, PbSe, PbS, PbTe, SnS, SnS$_2$, SnTe, AlInSb, GaAsN, GaAsSb, InAsSb, InGaSb, SiGe, SiSn, AlGaInP, AlInAs, InGaN, AlGaN, InGaP, HgZnTe, GaAsP, AlGaP, and InGaAs, or a combination thereof.

13. A method of fabricating a stacked structure, the method comprising:
    forming a two-dimensional material layer directly on a first material layer, the two-dimensional material layer comprising a plurality of holes each exposing a portion of the first material layer; and
    forming a second material layer directly on the two-dimensional material layer such that the second material layer is coupled to the first material layer through the plurality of holes,
    wherein the two-dimensional material layer comprises at least one of graphene, black phosphorus, amorphous boron nitride, two-dimensional hexagonal boron nitride (h-BN), phosphorene, or transition metal dichalcogenide, and
    wherein the two-dimensional material layer is between the first material layer and the second material layer.

14. The method of claim 13, wherein the forming the two-dimensional material layer comprises forming the two-dimensional material layer using at least one of a chemical vapor deposition (CVD) method or an atomic layer deposition (ALD) method.

15. The method of claim 13, wherein the forming the two-dimensional material layer comprises forming the two-dimensional material layer such that a coverage of the two-dimensional material layer on a top surface of the first material layer is about 0.6 to about 0.99.

16. The method of claim 15, wherein the first material layer comprises a metal material.

17. The method of claim 16, wherein the metal material comprises at least one of copper (Cu), molybdenum (Mo), nickel (Ni), aluminum (Al), tungsten (W), ruthenium (Ru), cobalt (Co), manganese (Mn), titanium (Ti), tantalum (Ta), gold (Au), hafnium (Hf), zirconium (Zr), zinc (Zn), yttrium (Y), chromium (Cr), gadolinium (Gd), brass, bronze, stainless steel, and germanium (Ge).

18. The method of claim 16, wherein the second material layer comprises a semiconductor material.

19. The method of claim 18, wherein
the semiconductor material comprises a material including at least two elements combined with each other, and
the at least two elements combined with each other include at least of Si, Ge, C, Zn, Cd, Al, Ga, In, B, C, N, P, S, Se, As, Sb, and Te.

20. The method of claim 16, wherein the second material layer comprises an insulating material.

21. The stacked structure of claim 1, wherein a lower surface of the two-dimensional material layer is coplanar with a lower surface of the second material layer.

* * * * *